United States Patent
Blaunshtein et al.

(10) Patent No.: US 9,560,529 B2
(45) Date of Patent: Jan. 31, 2017

(54) METHOD OF OPTIMIZING OPERATIONAL PARAMETERS OF WIRELESS NETWORKS IN TERRESTRIAL ENVIRONMENT

(71) Applicants: D.P. ELECTRONIC SYSTEMS LTD, Be'er Sheva (IL); Novel Technologies of Telecommunication Systems, Moscow (RU)

(72) Inventors: Nathan Blaunshtein, Be'er Sheva (IL); Nathalie Yarkoni, Be'er Sheva (IL)

(73) Assignees: D.P. ELECTRONIC SYSTEMS LTD., Beer Sheva (IL); NOVEL TECHNOLOGIES OF TELECOMMUNICATION SYSTEMS, Moscow (RU)

(*) Notice: Subject to any disclaimer, the term of this patent is extended or adjusted under 35 U.S.C. 154(b) by 453 days.

(21) Appl. No.: 14/085,202

(22) Filed: Nov. 20, 2013

(65) Prior Publication Data
US 2014/0170986 A1    Jun. 19, 2014

Related U.S. Application Data

(63) Continuation-in-part of application No. 12/301,320, filed as application No. PCT/IL2007/000605 on May 17, 2007, now abandoned.

(60) Provisional application No. 60/801,071, filed on May 18, 2006.

(51) Int. Cl.
*G06F 17/50* (2006.01)
*H04W 16/18* (2009.01)

(52) U.S. Cl.
CPC .......... *H04W 16/18* (2013.01); *G06F 17/5009* (2013.01)

(58) Field of Classification Search
USPC ............. 703/2, 6, 18; 455/506, 67.13, 63.2; 370/208, 252
See application file for complete search history.

(56) References Cited

U.S. PATENT DOCUMENTS

| 5,794,128 A * | 8/1998 | Brockel | H04B 17/3912 455/506 |
|---|---|---|---|
| 6,236,363 B1 | 5/2001 | Robbins et al. | |
| 6,356,758 B1 | 3/2002 | Almeida et al. | |
| 6,426,971 B1 | 7/2002 | Wu et al. | |

(Continued)

OTHER PUBLICATIONS

Laneman, et al, "Cooperative Diver sit in Wireless Networks. Efficient Protocols and Outage Behavior," 2004 IEEE, Dec. 2004 p. 3062-80.

(Continued)

*Primary Examiner* — Thai Phan
(74) *Attorney, Agent, or Firm* — Paul D. Bianco; Fleit Gibbons Gutman Bongini & Bianco PL

(57) ABSTRACT

A method for designing and analyzing a wireless network located at terrestrial environments by using a method based on an algorithm utilizing a 3D stochastic multi-parametric (3DSM) model of a terrain area designated for the wireless network. The algorithm is used for designing a wireless network operable in the area and analyzing the performance of the wireless network. The 3D model methodology is applicable for calculating average field intensity in different outdoor environments which is derived for a three-dimensional geometry model and yields higher precision calculations for the mixed residential or sub-urban areas by considering the wide range of vertical and horizontal dimensions of houses and trees.

10 Claims, 14 Drawing Sheets

(56) References Cited

U.S. PATENT DOCUMENTS

| | | | |
|---|---|---|---|
| 6,952,181 B2* | 10/2005 | Karr | G01C 21/206 |
| | | | 342/450 |
| 7,295,119 B2 | 11/2007 | Rappaport et al. | |
| 7,680,644 B2 | 3/2010 | Rappaport et al. | |
| 7,724,808 B2* | 5/2010 | Reial | H04B 1/7113 |
| | | | 375/150 |
| 2003/0053413 A1* | 3/2003 | Sawahashi | H04B 1/692 |
| | | | 370/208 |
| 2004/0095907 A1 | 5/2004 | Agee et al. | |
| 2014/0211644 A1* | 7/2014 | Giannakis | H04W 16/14 |
| | | | 370/252 |

OTHER PUBLICATIONS

Bertoni et al, "Propogatiori Prediction for Urban Systems", CRC Press LLC, 2002, 33 pages.
International Search Report mailed Jul. 16, 2008, for PCT/IL2007/000605 filed May 17, 2007.
International Preliminary Report on Patentability published Mar. 10, 2009, for PCT/IL2007/000605 filed May 17, 2007.
Written Opinion published Mar. 6, 2009, for PCT/IL2007/000605 filed May 17, 2007.

* cited by examiner

METHOD OF OPTIMIZING OPERATIONAL PARAMETERS OF WIRELESS NETWORKS IN TERRESTRIAL ENVIRONMENT

FIELD OF THE INVENTION

The present invention relates to a method of optimizing operational parameters of wireless networks and, more specifically, to a method adapted for real terrestrial environment.

BACKGROUND OF THE PRESENT INVENTION

Existing Approaches of Link Budget Design

A main characteristics of any type of wireless network performance is a Link Budjet that based on average path loss evaluation according to reaction and response of the corresponding terrestrial propagation channel, rural, mixed residential, sub-urbanm and urban. Existing approaches for average path loss prediction were fully described during recent decades [1-14]. Thus, the empirical Okumura-Hata model [1, 2], Bertoni approach [3-6], Walfish-Ikegami approach [7], and 2-D stochastic approach [8-10], require signal intensity decay law versus the range r between the terminal antenna, transmitter and receiver, of $$L(I) \propto d^{-\gamma}, \gamma=2.6-4.0 \quad (1)$$

Further, the abovementioned approaches were relevant only for specific scenarios, with accuracy of 10-15 dB relative to experimental data.

Approximate concept of link budget estimation were described, based on numerous experimental data obtained for various terrestrial communication links such as in Steele, R., *Mobile Radio Communications* (called the Steele's approach [11, 12]). According to this predicting concept, the expected median signal power at the moving vehicle/subscriber (MV/MS) must be derived, first of all, for determining the radio coverage of a specific base station (BS) and the interference tolerance for the purpose of cellular map construction. As suggested by Steele's approach, the total signal power at the receiver, $P_{RX}$, is also subjected to slow fading or shadowing and fast fading, which are mainly caused by the characteristic terrain features in the vicinity of BS and MV. Usually, when designing the network power budget and the coverage area patter, the slow and fast fading phenomena are taken into account, introducing a shadow fading margin $L_{SF}=2\sigma_{Sh}$, where $\sigma_{Sh}$ is the standard deviation of shadowing, as suggested in Steele's approach and in Rappaport, T. S., *Wireless Communications* [13], and a fast fading margin, $L_{FF}$, as functions of the range between BS and MV.

In other words, a shadow fading margin, which usually predicted to be in the range of about 1% to 2% of the slow fading lognormal PDF, and a fast fading margin, which is typically predicted to be the in the range of about 1% to 2% of the fast fading Rayleigh or Rice PDF, may be taken into account simultaneously or separately in link budget design depending on the worst-case scenario in the concrete communication channel. This situation is often referred to as "fading margin overload" resulting in a very low-level received signal almost entirely covered in noise. The probability of such worst cases determines the event of how rapidly the signal level drops below the receiver's noise floor level (NFL). The probability of such an event was predicted in Steele's approach as a sum of the individual margin overload probabilities, the slow and the fast, when the error probability is close to 0.5, since the received signal is at the NFL.

According to Steele's approach and Rappaport technique, one has a slow fading margin of $L_{SF}=2\sigma_{Sh}=10-15$ dB. There assuming the Rician fast fading PDF, as more general PDF for multipath channel prediction, with the Rician parameter K=5-10 and a fast fade margin overload probability of 1%, we can obtain a fast fading margin, using so-called the Rappaport's approach as $L_{FF}=5-7$ dB.

Another, concept of how to obtain the slow and fast fade margins was proposed in Saunders, S. R., *Antennas and Propagation for Wireless Communication Systems* (called also the Saunders' approach [14]). According to the proposed concept, the effect of slow fading or shadowing can be described as a difference between the median path loss, as predicted by any standard propagation model. To obtain the shadow fade margin, one needs information of PDF distribution of slow fading, also defined as a Gaussian process with a zero-mean Gaussian variable $L_{SF}$ and with a standard deviation of shadowing $\sigma_L$.

Using concept described in Saunders' approach, one can also estimate the fast fade margine, $L_{FF}$, using well-known Ricean PDF distribution of such parameter. We will rewrite it using a new notation as $$PDF(L_{FF}) = \frac{2L_{FF}}{(\text{rms})^2} \exp\left\{-\frac{L_{FF}^2}{(\text{rms})^2}\right\} \cdot \exp(-K) \cdot J_0\left(\frac{2L_{FF}}{\text{rms}}\sqrt{K}\right) \quad (2)$$

where, as in prior researches, $\text{rms}=\sqrt{2}\cdot\sigma_F$, $\sigma_F$ is the variance of fast fading, which can be defined as following:

$$\sigma_F = \int_0^\infty x^2 \cdot p(x) dx - \left(\int_0^\infty x \cdot p(x) \cdot dx\right)^2 \quad (3a)$$

Using derivations carried out in *Wireless Communication Systems*, in *Handbook of Engineering Electromagnetics* [10], we finally get:

$$\sigma_F = [2\cdot(\text{rms})^2 \cdot e^{-K}] \cdot \left[\frac{1}{2} \cdot e^K \int_0^\infty y^3 \cdot e^{-y^2} \cdot I_0(2\cdot\sqrt{K}\cdot y) \cdot dy - \left(\int_0^\infty y^2 e^{-y^2} \cdot I_0(2\cdot\sqrt{K}\cdot y) \cdot dy\right)^2\right]^{1/2} \quad (3b)$$

So, as above for slow fading, we have here the loss due to fast fading, which can be expressed as:

$$L_{FF}=10\cdot\log_{10}(\sigma_F)[\text{dB}] \quad (4)$$

Here in (3b) the Ricean parameter K is presented as the ratio of LOS component (deterministic part of the total signal) and NLOS component (random part of the total signal), i.e., $$K = \frac{LOS - \text{component}}{NLOS - \text{component}} = \frac{\langle I_{co}\rangle}{\langle I_{inc}\rangle} \quad (5)$$

In (5), $\langle I_{co}\rangle$ and $\langle I_{incc}\rangle$ are the coherent and incoherent parts of the total field intensity, respectively. When parameters rms and K a-priori are known, one can, by use of results presented in [10], find $L_{FF}$.

According to the scenario of how to obtain the link power budget proposed in Saunders' approach [14] one has two variants of link-budget design prediction. The first variant describes Estimation of the slow fade margin, z, deriving the median path loss, $\bar{L}$, by using well-known propagation models, and using the maximum acceptable path loss, $L_m$, as well as the range between concrete terminal antennas, the knowledge of which is done for the performed wireless system. Estimation of fast fade margin can be done, if the standard deviation and the Ricean parameter K are known for the concrete propagation channel and wireless system. The second variant describes estimation of the slow fade margin, z, and the range between concrete terminal antennas using derivation of the median path loss, $\bar{L}$, through well-known propagation models, and using the standard deviation of slow fading, $\sigma_L$, as well as the percentage of the success communication for the concrete wireless system performed.

As for the fast fade margin, $L_{FF}$, it can be obtained if the standard deviation of fast fading, $\sigma$, or rms, as well as the probability of the successful communication are known for the concrete wireless system. These approaches are not precise and require a great amount of measurements and statistical analysis.

Existing Approaches for Cellular Maps Design

To arrange the effective splitting of tested built-up area at cells, the designers need strict information about the law of signal power decay for the concrete situation in the site of service, i.e., need strict link budget analysis of propagation situation within each communication channel, as well as full radio coverage of each subscriber located LOS or NLOS conditions in areas of service, giving exact clearance between subscribers within each cell. Based on precise knowledge of propagation phenomena inside the cellular communication channels, it is easy to optimize cellular characteristics, such as radius of cell, reuse factor Q, channel interference parameter C/I, etc [12-14].

Standard Definition of Radius of Cell. As follows from prior researches [15-25], a better clearance between the base station (BS) and moving subscribers (MS) in clutter conditions may be reached only for LOS conditions (or direct visibility) between them. In this case, as follows from the two-ray model and the waveguide street model (see above), the cell size, $R_{cell}$, cannot be larger than the break point range, $r_B$, at which the decay of the signal is changed from $\gamma=2$ (as in free space propagation) to $\gamma=4$ (propagation above flat terrain). If so, the law of signal decay between BS and each MS in the cell of radius $R_{cell} \leq r_B$ is $R_{cell}^{-2}$. Generally speaking, beyond the break point the law of signal decays versus the range between terminal antennas, describing by path-loss slope parameter $\gamma$, depends on the concrete situation in the urban scene and may be proportional to $R^{-\gamma}$ with $\gamma>2$ ($\gamma=4-6$, see standard propagation models presented above).

As follows from other models in rural and mixed residential areas with a rare buildings' distribution the path-loss slope parameter $\gamma$ describing the received signal decay is changed from $\gamma=2.5$ to $\gamma=4.0$, which in a good agreement with existing propagation models (see above). In other words, in such areas field attenuation is faster than that in LOS conditions of free space.

Co-channel Interference Parameter Definition. Using standard methods of C/I evaluation, one can easy estimate this ratio based on the classical formula:

$$\frac{C}{I} = 10\log\left[\frac{1}{6}\left(\frac{D^\gamma}{R_{cell}^\gamma}\right)\right] \quad (6)$$

where, according to strategy of cellular pattern design described in [10-14], D is the reuse distance between co-interferer cells operated with the same frequency bands and $\gamma$ is a factor of signal strength attenuation inside and outside the cell, as is illustrated by these figures.

Existing Methods of Channel (Frequency) Assignment

Let us briefly introduce a well-known heuristic approach on how to obtain C/I-ratio based on mathematical models by accounting the Walfisch-Ikegami model (WIM) [7, 10] of signal power decay in urban environment.

The frequency assignment problem, was represented in the form of the heuristic algorithm developed in [15-17] based on cell configuration, which does not follow the classical hexagonal-cell homogeneous concept with a periodic frequency reuse pattern. This algorithm is based on the binary constraints between pair if transmitters presented in the following form:

$$|f_i - f_j| > k, k \geq 0 \quad (7)$$

where $f_i$ and $f_j$ are the frequencies assigned to transmitters i and j, respectively. Different configurations of the cellular pattern were analyzed for channel (frequency) assignment purposes with applications to real non-regular non-uniform radio networks, mobile and stationary, considering:

cellular maps with different dimensions of cells,
cellular maps with irregular shapes of cells,
cellular maps with certain level of intercell overlapping.
For such configurations of cells we need, instead of classical formulation of carrier to interference ratio (C/I) for various $\gamma$, to use the following formula [10-14]:

$$\left(\frac{C}{I}\right)_i = \frac{R_i^{-4}}{\sum_{j \in M_i} d_{ij}^{-4}} \quad (8)$$

Here, we take a simple two-ray propagation model (called also the "flat terrain" model) with $\gamma=4$. Notice that all notations are changed here from those used in to be unified with those used in this patent presentation. Here $R_i$ is a radius of cell i; $M_i$ is the set of all the cells (excluding cell i) which use the same bandwidths (channels) as cell i; $d_{ij}$ is the worst case distance between interfering cell j and cell i. The latter can be found as $$d_{ij} = \sqrt{(x_i-x_j)^2 + (y_i-y_j)^2} - R_i \quad (9)$$

where $(x_i, y_i)$ and $(x_j, y_j)$ are the Cartesian coordinates of base stations (BSs) of cells i and j, respectively. Using this simplest propagation model, in the co-channel interference constraint was obtained for C/I threshold $\alpha=1/\beta=18$ dB [18-25]:

$$\sum_{j \in M_i} \frac{d_{ij}^{-4}}{R_i^{-4}} \leq \beta \quad (10)$$

Sufficient improvements of model were obtained by introducing adjacent channel interference $adj\_factor_k = -a(1+\log_2 k)$, where k is the bandwidth separation (in number of channels) between the adjacent channel frequency and central frequency of the corresponding filter. Typical value for a is 18 dB (as $\alpha=18$ dB in [21]), and for k=1 an adjacent channel is attenuated by a factor equal to 0.015 [22-25].

Existing Methods of Grade-of-Service (GoS) Performance

The fixed (FWA) or mobile (MWA) wireless access systems, unlike the wire-line systems, may have degraded quality of service (QoS) due to low link reliability caused by propagation characteristics (such as shadowing, multipath or multi-carrier interference and sensitivity of receivers) and by degradation of grade of service (GOS), due to high service demand and a low number of call resources. The most elementary stage of a system deployment is the link budget design, which is the main parameter of wireless communication links. It is based on propagation characteristics of the channel and describes signal power distribution along the radio path between the base-station antenna and terminal. The link budget is a balance sheet of gains and losses. As was mentioned above, by calculating the link budget, we evaluate the link performance.

The fixed (FWA) or mobile (MWA) wireless access systems, unlike the wire-line systems, may have degraded quality of service (QoS) due to low link reliability caused by propagation characteristics (such as shadowing, multipath or multi-carrier interference and sensitivity of receivers) and by degradation of grade of service (GOS), due to high service demand and a low number of call resources.

As for the GOS, a classical GOS analysis for circuit-switched (voice) traffic uses the Erlang-B or Erlang-C formulas, which is a special case of the birth and death (B&D) equation for calculating the total system capacity and the probability of working without call congestion [26-28]. Other models are used for other types of traffic, however most used in the literature classical approach is based on these formulas. So, we will focus on the Erlang B model. This, finally, the estimated total grade of service (GoS), which is the probability that a user tries to initiate a call and the call is either blocked or drops is calculated by both of those procedures together. However, Erlang-B formula is justified only in cases where all users have access to all resources of the system (a situation of full-availability). In wireless systems, due to propagation limitations, such as obstacles and wave attenuation, one user has limited access to the system resources. This is referred to as limited-availability and, thus, we cannot use the classical approach of using Erlang-B formula according to [26-29].

Moreover, in FWA systems, one user gets service from one cell. The user is part of a user group that is covered by one or more cells. If one user has optional access to more than one cell, the system has to allocate the user to one of these cells in order to achieve an optimal grade-of-service; this refers to load-balancing. The decision rule of user allocation refers to the load-balancing algorithm.

Therefore, to cover existing limitations, we propose below a new approach and methodology, as an extension of the existing classical approach mentioned above. As in other sections above, in our novel stochastic multi-parametric approach we take into account two types of areas, following [30-34]: mixed residential area having low buildings with trees and vegetation and urban area containing mostly high buildings in a dense built-up area.

Existing Approaches of Quality of Service (QOS) Performance

QoS is defined by characteristics called the capacity, as a maximum rate of data stream via the communication channel. The capacity of a communication channel is defined as the traffic load of data in bits per second. It is accepted to use Shannon-Hartley formula, in order to calculate the capacity of the channel [26-28]:

$$C = B_w \log_2[1+SNR] \qquad (11)$$

where SNR is the signal-to-noise ratio for the channel with the additive white Gaussian noise (AWGN). Here, we will define SNR as a measure of the signal strength relative to the noise. The ratio is usually measured in dB.

$$SNR = 10\log\left(\frac{P_R}{N_R}\right) = P_{R[dB]} - N_{R[dB]} \qquad (12)$$

The classical approach is usually used to estimate the data capacity of the communication link using (11)-(12). According to its definition, the capacity of an AWGN channel of bandwidth $B_w$, wherein the signal to noise ratio is $\rho$, is given by:

$$C = B_w \log_2[1+\rho] \qquad (13)$$

and the spectral efficiency is given by:

$$\tilde{C} = \frac{C}{B_w} = \log_2[1+\rho] \qquad (14)$$

In the first approach only the Gaussian noise (called additive) density $N_0$ inside the channel with a large bandwidth $B_w$ of noise spectrum is taken into account, i.e., $$C = B_w \log_2\left[1 + \frac{S}{N_0 B_w}\right] \qquad (15)$$

Here C is the channel capacity in bits per second, $B_w$ is the one-way transmission bandwidth of the channel in Hz, S is the signal power in W=J/s, and $N_0$ is the single-sided additive (white) noise power spectral density also in W/Hz, that is, $N_{add} = N_0 B_w$. Practical channels are compared to the ideal channel by selecting detection error probability of $10^{-6}$ and finding the SNR necessary to achieve it. Another criterion of efficiency of the communication channel can be defined by use other data stream parameter such as the bit error rate (BER). The BER usually is achieved at a practical communication system. For example, for an encoded BPSK system, the BER is given by:

$$BER(\rho) = Q(\sqrt{2\rho}) \qquad (16)$$

Here $Q(\cdot)$ is the tabulated classical Gaussian function. For BER in the percentage of bits that have errors relative to the total number of bits received in a transmission another formula can be used [29]:

$$BER = \frac{1}{2}\int_0^\infty p(x)\mathrm{erfc}\left(\frac{SNR}{2\sqrt{2}}x\right)dx \qquad (17)$$

where p(x) is the probability density function and erfc(·) is the well-known error function [13, 26-29].

Using these parameters, each designer of wireless networks can easily predict data stream parameters within each communication link with AWGN. Effects of interference can be regarded as another source of effective noise, which raises the noise level for calculating the error rates. In this case we must introduce in (8.4) together with $N_{add}$ also the noise caused by interference $N_{int}$.

As was shown by Rappaport [13], each Gaussian-like noise can be additively taken into account in the denominator of formula (11). Thus for K-carrier system each carrier/subscriber of number i can affect the desired subscriber as an additional interferer which can be described by a Gaussian-like noise. Then, according to Rappaport, we can write:

$$C = B_w \log_2 \left[ 1 + \frac{S}{N_0 B_w + \sum_{i=1}^{K-1} N_i} \right] \quad (18)$$

where $N_i$ is the power of i-subscriber which affects as a additive white noise for the desired subscriber.

SUMMARY OF THE INVENTION

It is hence one object of the invention to disclose a method of analyzing wireless network located in a terrestrial environment. The aforesaid method comprises the steps of: (a) obtaining built-up terrain elevation data; (b) computing three-dimensional radio path profile; (c) creating a digital map cover comprising actual heights of obstructions in said terrestrial environment; (d) computing clearance conditions between antennas of said wireless network; (e) computing an average path loss distribution; (f) computing a standard deviation of slow fading, $\sigma_L$, being a logarithm of ratio between the signal intensity, with and without diffraction phenomena; and (g) computing the fade margin.

Another object of the invention is to disclose the step of creating the digital map based on at least one parameter selected from a group consisting of a terrain elevation, a clutter distribution, an effective antenna height, an antenna pattern, an antenna directivity, an antenna effective radiated power and an operating frequency.

A further object of the invention is to disclose the step of computing average path loss distribution provided in mixed residential areas, sub-urban areas, urban areas or any combination thereof.

A further object of the invention is to disclose the step of computing said standard deviation of slow fading, $\sigma_L$, performed either for single diffraction and double diffraction scenarios.

A further object of the invention is to disclose the step of computing said fade margin performed both in the cases of slow and fast fading.

A further object of the invention is to disclose the method comprising a step of distinguishing areas according to computed path losses based on at least one parameter selected from a group consisting of a terrain elevation, a clutter distribution, an effective antenna height, an antenna pattern, an antenna directivity, an effective radiated power and an operating frequency.

A further object of the invention is to disclose the method comprising a step of computing an efficient cell radius of an area of stable communication between users and base station antenna based on K-parameter and a minimum cell radius.

A further object of the invention is to disclose the step of defining computing said efficient cell radius performed for area selected from the group consisting of a mixed residential area, a sub-urban area, a urban area and any combination thereof.

A further object of the invention is to disclose step of computing said efficient cell radius performed providing maximum acceptable path losses.

A further object of the invention is to disclose the method comprising determining a co-channel interference parameter and signal-to-noise ratio.

BRIEF DESCRIPTION OF THE FIGURES

In order to understand the invention and to see how it may be implemented in practice, and by way of non-limiting example only, with reference to the accompanying drawing, in which FIG. 1 describes a mixed residential region scenario, where the base station antenna is higher than houses rooftops, surrounded by trees and vegetation.

DETAILED DESCRIPTION OF THE PREFERRED EMBODIMENTS

Figure 1:
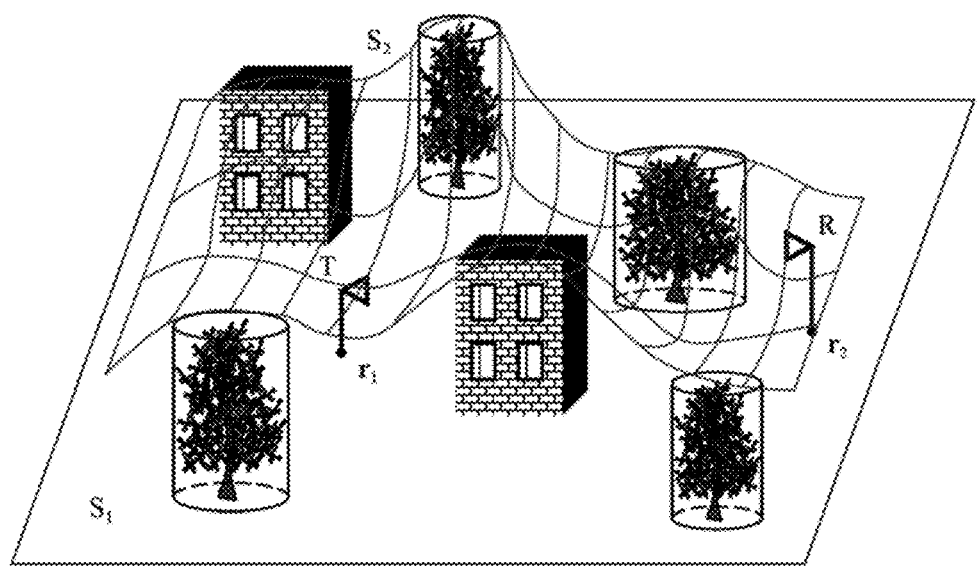

The following description is provided, alongside all paragraphs of the present invention, so as to enable any person skilled in the art to make use of the said invention and sets forth the best modes considered by the inventor for carrying out this invention. Various modifications, however, will remain apparent to those skilled in the art, since the generic principles of the present invention have been defined specifically to provide a high-precision efficient method for analyzing wireless network located at terrestrial environments.

The present invention discloses many aspects in wireless communication. All of them are based on novel implementation and use of topographic maps. The use of different topographic maps and dividing the communication parameters to different scenarios enables systems to reach important data and results much quicker and be much more precise in terms of number of users (Grade of Service) per base station (BS), signal to noise ratio (QoS), channel allocation and more.

The term 'high precision' refers hereinafter to the level of variation between the theoretical predictions according to the proposed novel stochastic approach and the experimental data. Variation of less than 5 dB is described as high precision The term 'efficiency' refers hereinafter to the number of steps and/or the number of calculations required in order to analyze specific aspects in wireless networks, such as Quality of Service (QoS), Grade of Service (GoS), channel allocation, link budget, radio map design, cellular map design, and Average Path Loss (APS).

The term 'Terrain elevation data' refers hereinafter to a digital terrain map, consisting of ground heights as grid points $h_q(x,y)$.

The term 'clutter map' refers hereinafter to the ground cover of artificial and natural obstructions as a distribution of grid points, $h_0(x,y)$, for built-up areas this is the buildings' overlay profile $F(z_1, z_2)$; the average length or width of obstructions, $\langle L \rangle$ or $\langle d \rangle$; the average height of obstructions in the test area, $\bar{h}$, according to (2.9) presented below; the obstructions density per $km^2$, $\nu$.

The term 'effective antenna height' refers hereinafter to the antenna height plus a ground or obstruction height, if the antenna is assembled on a concrete obstruction: $z_1$ and $z_2$ for the transmitter and receiver, respectively.

The term 'bit error rate (BER)' refers hereinafter to the ratio of bits received with errors to the total number of bits transmitted (expressed as a fraction or percent). In telecommunication, the quality of voice service is specified by two measures: The GOS (grade of service) and the QoS (quality of service).

The term 'Grade of service' is the probability of a call in a circuit group being blocked or delayed for more than a specified interval, expressed as a vulgar fraction or decimal fraction. This is with reference to the busy hour when the traffic intensity is the greatest. Grade of service may be viewed independently from the perspective of incoming versus outgoing calls, and is not necessarily equal in each direction or between different source-destination pairs.

The term 'Quality of service' which Criteria for mobile quality of service in cellular telephone circuits include the probability of abnormal termination of the call, and signal to noise ratio (SNR).

The term 'link budget' refers hereinafter to the accounting of all of the gains and losses from the transmitter, through the medium (free space, cable, waveguide, fiber, etc.) to the receiver in a telecommunication system. It takes into account the attenuation of the transmitted signal due to propagation, as well as the loss, or gain, due to the antenna. Random attenuations such as fading are not taken into account in link budget calculations with the assumption that fading will be handled with diversity techniques.

Link Budget Design Based on the Novel 3-D Stochastic Multi-Parametric Model

The improved theory of the average field intensity in different outdoor has been derived for three-dimensional (3-D) case by the authors of this invention and fully described in [30-39].

For the mixed residential areas (see FIG. 1), the obtained formulas are more general and correct and take into account wide range of vertical and horizontal dimensions of houses and trees compared with formulas performed in [8, 9], that is, $$\langle I_{inc} \rangle = \frac{\Gamma}{8\pi} \cdot \frac{\lambda \cdot l_h}{\lambda^2 + [2\pi l_h L \gamma_0]^2} \cdot \frac{\lambda \cdot l_v}{\lambda^2 + [2\pi l_v \gamma_0 (\bar{h} - z_1)]^2} \cdot \frac{(z_2 - \bar{h})}{d^3} \quad (19)$$

Here we take into account distribution of scattered waves from the horizontal (defined by $l_h$) and vertical (defined by $l_v$) axis of obstruction's plane, which allows us to account various dimensions of the obstructions, such as houses, trees or hills. The corresponding formula for the coherent part of the average total field intensity is obtained at the same manner as in, that is, $$\langle I_{co} \rangle = \exp\left\{-\gamma_0 d \frac{\bar{h} - z_1}{z_2 - z_1}\right\} \left[\frac{\sin(kz_1 z_2 / d)}{2\pi d}\right]^2 \quad (20)$$

Figure 2A:
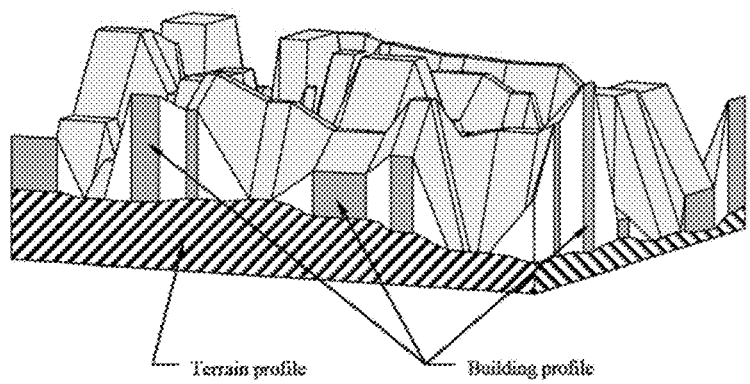
FIGS. 2a and 2b describe an urban scenario, where buildings are randomly distributed on the rough terrain with complicated buildings' overlay profile.
Figure 2B:
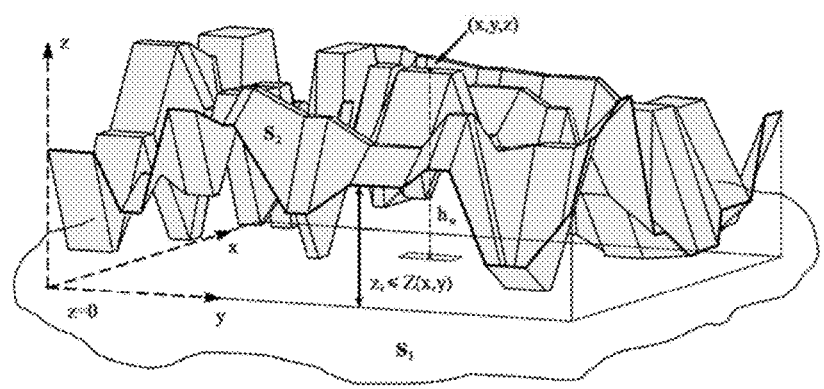

For the urban environments, as more complicated case (see FIG. 2), the expression for the incoherent part of the total field intensity can be presented, taking into account single scattering and diffraction from buildings' corners and rooftops (i.e., for 3-D case) and the buildings' overlay profile $F(z_1, z_2)$:

$$\langle I_{inc1} \rangle = \frac{\Gamma \lambda l_v \left[(\lambda d / 4\pi^3) + (z_2 - \bar{h})^2\right]^{1/2}}{8\pi [\lambda^2 + (2\pi l_v \gamma_0 F(z_1, z_2))^2] d^3} \quad (21)$$

The corresponding formula for double scattering and diffraction is given by:

$$\langle I_{inc2} \rangle = \frac{\Gamma^2 \lambda^3 l_v^2 \left[(\lambda d / 4\pi^3) + (z_2 - \bar{h})^2\right]}{24\pi^2 [\lambda^2 + (2\pi l_v \gamma_0 F(z_1, z_2))^2]^2 d^3} \quad (22)$$

In accordance with this relief function, the coherent part of the total field intensity can now obtained as:

$$\langle I_{co} \rangle = \exp\left\{-\gamma_0 d \frac{F(z_1, z_2)}{(z_2 - z_1)}\right\} \frac{\sin^2(kz_1 z_2 / d)}{4\pi^2 d^2} \quad (23)$$

In formulas (21)-(23), a relief function $F(z_1, z_2)$ is introduced, which is better suited to describe realistic and general cases of built-up terrain and buildings' overlay profile, and for different elevations of transmitter and receiver antennas. The relief function $F(z_1, z_2)$ has the polynomial form with the power n which for n<1 described situation with higher buildings and for n>1 is with lower buildings. For n=1 this function limits simply to $(\bar{h}-z_1)$. Therefore, formulas (21)-(23) are more realistic than those obtained by use 2-D model [8, 9] and can precisely describe each scenario occur in the urban scene.

Furthermore, these formulas describe the frequency dependence of the propagation process inside the layer of city buildings: $\sim f^{-q}$ with q<0 for frequencies in the VHF-band and lower part of the UHF-band (f<<1 GHz), and $\sim f^{-q}$ with q>0 for the UHF-band and higher (f>0.5 GHz).

The total wave field intensity from the transmitter is a superposition of a scattered (incoherent) spectrum $\langle I_{inc} \rangle$ described by (19) (for mixed and sub-urban areas) and/or (21) and (22) (for urban areas), and a coherent spectrum $\langle I_{co} \rangle$ of total field energy described by (20) and/or (23), i.e., For mixed residential areas $$\langle I_{total} \rangle = \langle I_{co} \rangle + \langle I_{inc} \rangle \quad (24)$$

For urban areas $$\langle I_{total} \rangle = \langle I_{co} \rangle + \langle I_{inc1} \rangle + \langle I_{inc2} \rangle \quad (25)$$

and the corresponding path loss in dB is given by $$L=10 \log [\lambda^2(<I_{co}>+<I_{inc}>)] \quad (26)$$

$$L=10 \log [\lambda^2(<I_{co}>+<I_{inc1}>+<I_{inc2}>)] \quad (27)$$

As follows from presented formulas (1.10)-(1.14), the attenuation slope parameter γ for more general situation in the urban scene with randomly distributed buildings placed on rough terrain is: for the case when $\langle I_{inc} \rangle > \langle I_{co} \rangle$ $$\gamma = 2.5-3.0 \quad (28)$$

For the case $\langle I_{inc} \rangle < \rangle I_{co} \langle$, since $I_{co} \sim d^{-2} \cdot \exp(-\alpha d) \approx (d^{-2} - d^{-5})$ we obtain, depending on the parameter α and distance d much widely range of signal intensity attenuation, that is, $$\gamma = 2.0-5.0 \quad (29)$$

These results cover the well-known empirical, semi-empirical, statistical and analytical 2-D models mentioned above and described in [1-9], to obtain path loss dependence with the range between two terminal antennas at the both ends of outdoor communication links, and therefore give radio coverage of each zone serviced by these terminal antennas.

In link budget performance, we use the proposed 3-D stochastic multi-parametric approach for evaluation of pure path loss, as an average characteristics of signal energy attenuation (in decibels, dB) and the effects of fading caused by shadowing due to diffraction from building rooftops or corners (called the large-scale fading), and due to multiple scattering phenomena (called the small-scaled fading).

Thus, having now information on the average path loss, effects of large-scale and small-scale fading, we can design more precisely a link budget according the proposed concepts based on the fact that the total path loss inside the communication link, consists three main terms which satisfy three independent statistical processes and then are described by three independent characteristics of the signal power decay: the median path loss or the mean signal power decay along the radio path, $\bar{L}$, which describe the probability to obtain the real signal power decay over 50% of locations and during 50% of time inside the test area, the slow fading or the characteristic of shadowing, $L_{SF}$, and the characteristic of fast fading, $L_{FF}$, e.g., $$L_{Link} = \bar{L} + L_{SF} + L_{FF} \quad (30)$$

As was shown in prior researches, these characteristics in general vary as a function of propagation range between terminal antennas, operating frequency, spatial distribution of natural and man-made obstructions placed surrounding these antennas, vehicles' speed and antennas' height with respect to obstructions, etc. During the link budget performance we do not enter into the subject of the type of the terminal antennas. The parameters of antennas, BS and MS, can be easily included in the formulas obtained below by introducing their gains, $G_{BS}$ and $G_{MS}$, respectively.

Radio Maps Design

Figure 3:
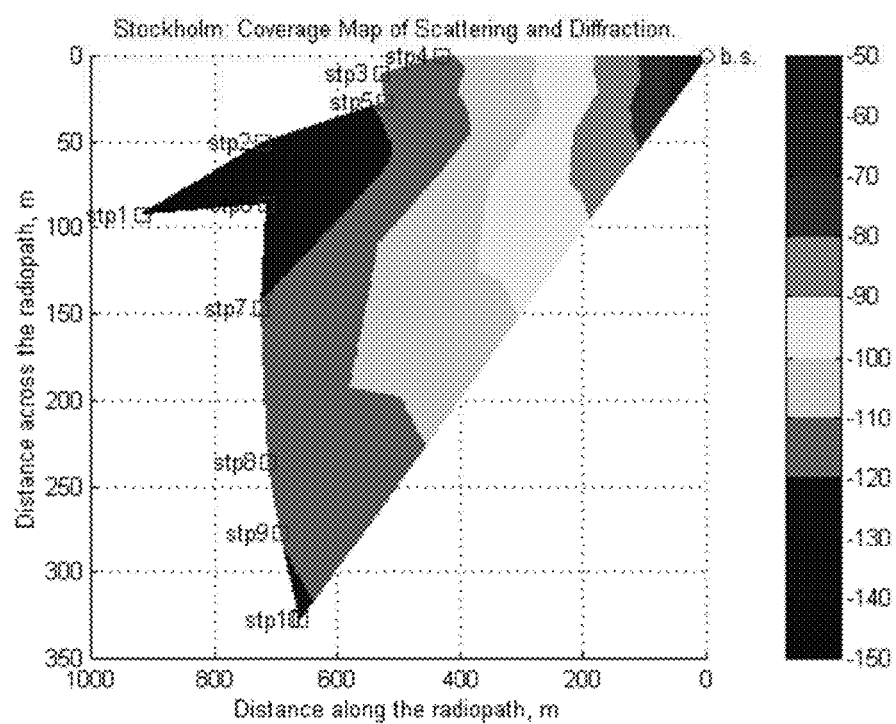
FIG. 3 describes Radio map of the experimental site of the Stockholm.

Based on link budget and the total path loss prediction in different outdoor radio communication links mentioned above, it is very simple to obtain the radio pattern of the area of service based on the corresponding models of radio propagation. As an example, the radio map of the Stockholm, shown in FIG. 3, was performed numerically, based on the topographic built-up map of the area of service and on the improved multi-parametric stochastic approach described above. The deviations between the improved stochastic model and the experiment are small enough (of about 3-4 dB), whereas results obtained from the simplified stochastic model give error of about 8-9 dB compared with the experiment. At the same time the error compared with the experimental data can achieve 10-15 dB if we use for radio coverage prediction the Hata model or the Walfish-Ikegami approach.

Another example of the radio map design with link budget strict evaluation by use the novel stochastic approach based on path loss and fading occur in the specific test-site area with specific topographic features of built-up terrain and evaluations of base station and mobile subscriber antenna, is the Ramat-Gan stock market in Tel Aviv.

Figure 4:
FIG. 4 describes stock market area in Ramat-Gan.

The Ramat-Gan stock market area is a very dense area, as can be seen from FIG. 4. It can be easily prototyped as a typical "Down-Town" area with tall buildings that are very dense.

Figure 5:
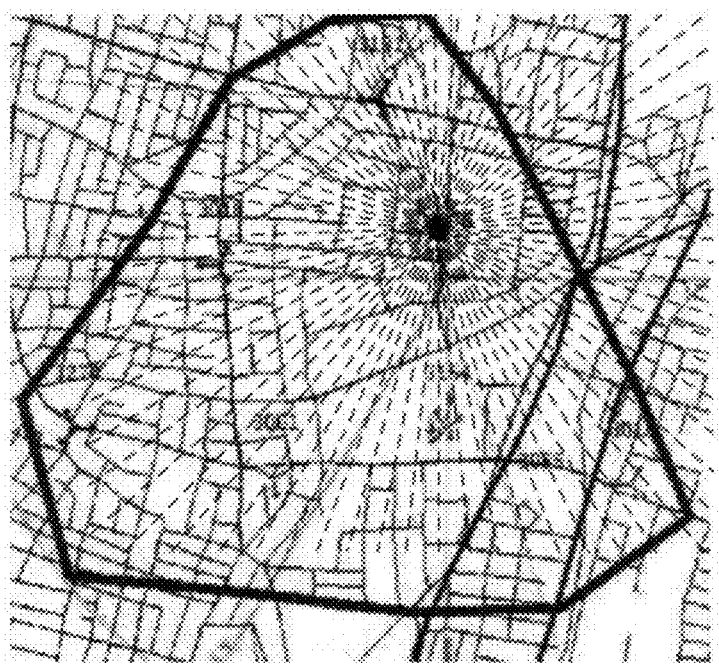
FIG. 5 describes a map indicating antennas locations at the stock market area, Ramat-Gan, the dotted lines are the radio paths from BS to any subscriber located at the test-site area.
Figure 6:
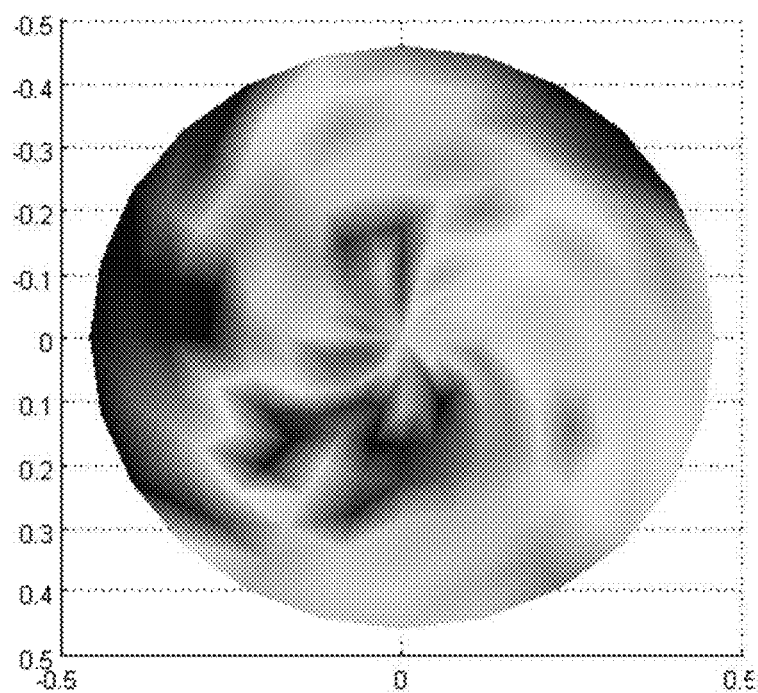
FIG. 6 describes attenuation slope parameter $\gamma_0$-map of the stock market area in Ramat-Gan.

The first stage of the simulation was to process the physical data. We have, measured the dimensions of each building near the antenna, and calculated the buildings average height for every path stretched each 5°, as seen in FIG. 5. Then, we have estimated the number of buildings per km² in test-site area, their average length or width (related to the direction of the antenna main loop orientation), and the buildings' contour density $\gamma_0$. Then the buildings' density $\gamma_0$ of test-site area was simulated and presented in FIG. 6.

The antenna characteristics, such as "sector", tilt, height ($z_2$), effective power ("Eff") and gain ("G"), as well as the terrain parameters, such as $\gamma_0$, the distance d between BS and MS, and step Δd along the radio path between BS and MS used for this simulation are presented in Table 1. We notice that in first column, the values represent the angle of the sector with reference to 0° (north).

TABLE 1

| Sector [deg] | $\gamma_0$ (gamma) [m$^{-1}$] | $z_2$ [m] | d [m] | Δd [m] | Tilt (α) [deg] | Eff [dB] | G dBi |
|---|---|---|---|---|---|---|---|
| 90 | 10e-3 | 50 | 200 | 5 | 4 | 8.8 | 12.5 |
| 220 | 10e-3 | 50 | 1500 | 20 | 6 | 8.8 | 12.5 |
| 330 | 10e-3 | 50 | 500 | 10 | 4 | 8.8 | 12.5 |

The simulation running constants and variables are the following:

$z_1 = 2[m]; l_v = 2[m]; f_0 = 900 [MHz]; |\Gamma| = 0.7-0.8$ $$\lambda = \frac{3 \cdot 10^8}{f_0} \approx 0.33 [m] \quad (21)$$

Figure 7:
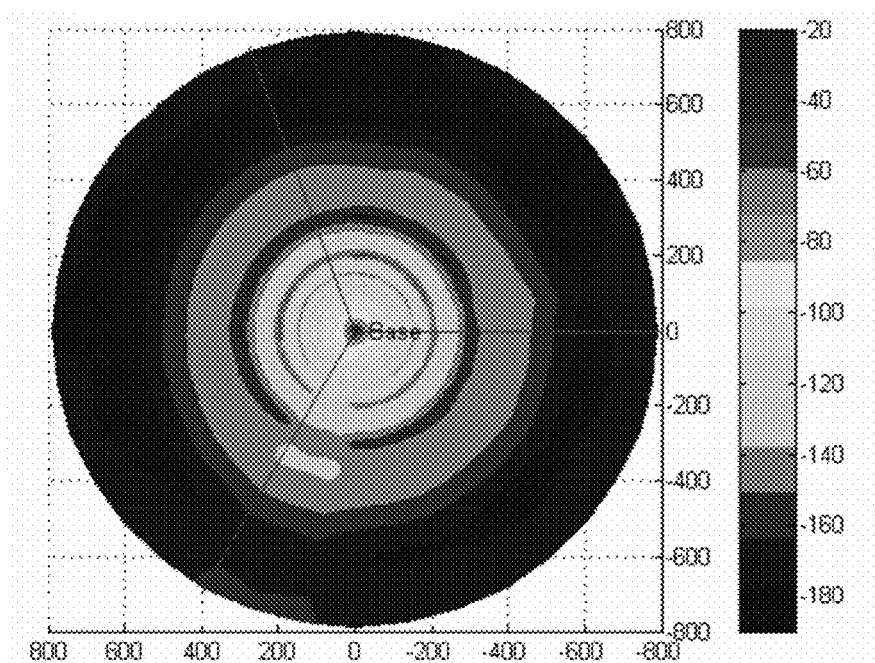
FIG. 7 describes radio map of the stock market area in Ramat-Gan.

Finally, using the stochastic model we have created a radio map for the test-site area of 1.6 km to 1.6 km, depicted in FIG. 7, where at the right-side the path loss (in dBm) is presented by colored segments corresponding to the obtained magnitudes of loss.

Here, for computations we used formulas (3.5)-(3.6), since the BS antenna was elevated above the built-up profile with the average building of $\bar{h}=18.3$ m. As it is seen from FIG. 8, at the ranges close to BS antenna (100-300 m) the path loss is varied from −100 dBm to −120 dBm, whereas far from BS antenna (at 500-800 m) it varies from −150 dBm to −180 dBm.

Cellular Maps Design

Novel Approach based on the Stochastic Propagation Model. At the same time, as follows from numerical calculations of the multi-parametric model, described in [30-39], for various situations of both antennas placed in a built-up area with a high density of irregularly distributed buildings, the law of signal power decay is changed with distance d between antennas from $\sim d^{-\gamma}$ ($\gamma=2$) before the break point $r_B$ (where the coherent part of total field is predominant) to $\sim d^{-\gamma}$ ($\gamma=2.5-4$) beyond the break point $r_B$ (where the incoherent part of total field is predominant). Therefore, it is obviously to obtain the minimum cell size, $R_{cell}$, defined as the break point $r_B$, in variant of cities with crossing-street grid plan.

In fact, for urban areas with a rectangular grid plan of straight crossing streets, when the multi-slit street waveguide model (described in [10]), the cell size can be described by the following formula, where, as above, we eliminate effects of diffraction from building corners:

$$R_{cell} \equiv r_B = \frac{4h_T h_R}{\lambda} \frac{(1+\chi)}{(1-\chi)} \frac{\lfloor 1 + h_b/a + h_T h_R/a^2 \rfloor}{|R_n|^2} \quad (22)$$

where all parameters in (4.1) are described above before formula (2.15). As follows from (4.1), using information about street geometry, such as the street width a, the average height of buildings $h_b$, and the mean gaps between buildings lining the street, i.e., the parameter of brokenness $\chi$, as well as about both antennas height, $h_T$ and $h_R$, and the building walls' material (which determines by the absolute value of reflection coefficient $R_n$), we can easily obtain the cell radius along the crossing streets.

In the case of built-up areas with non-regularly distributed buildings placed on rough terrain, consisting of hills, buildings and other obstructions located in residential zones, the cell size can be obtained by using the probabilistic approach presented above according to the multi-parametric stochastic model. As follows from this approach, the average distance of the direct visibility $\bar{\rho}$ between two arbitrary points, the source and the observer, is described by the following formula:

$$\bar{\rho} = (\gamma_0 \gamma_{12})^{-1} (km) \quad (23)$$

where $\gamma_{12}$ is dimensionless parameter described effects of buildings' overlay profile, $0<\gamma_{12}\leq 1$ and $\gamma_0 = 2\bar{L}v/\pi$ (km$^{-1}$) is the 1-D density of buildings' contours. For uniform distribution of buildings' heights, when $\gamma_{12}=1$, (22) can be simplified as $$\bar{\rho} = (\gamma_0)^{-1} = \frac{\pi}{2\bar{L}_v} \text{ (km)} \quad (24)$$

If now we can obtain, using the corresponding topographic built-up maps, the information about servicing areas, i.e., about the buildings' overlay profile with parameters of building overlay heights' pattern n and their average height $\bar{h}$ and about average buildings' length $\bar{L}$, as well as the density of buildings per square kilometer, it is easy to estimate the cell radius within the tested area by use of formulas (23) or (22).

So, by use of formulas (22)-(24) for specific scenarios occurred in the land communication environment, we can easily obtain the minimum cell radius for different built-up areas with various situations of the terminal antennas, BS and MS. Such receipt of cellular maps constructions is more general than that based on two-ray model both for LOS and NLOS conditions.

Definition of Radius of Cell by K-factor. Taking into account fading phenomena, we can also estimate the maximum cell radius based on the definition of Ricean K-factor and the corresponding evaluation of this parameter presented above (see formula (5)), which now can be presented in the following manner a) for mixed residential areas with vegetations:

$$K = \frac{I_{co}}{I_{inc}} \quad (25a)$$

$$= \frac{\exp\left\{-\gamma_0 \cdot d \frac{\bar{h}-z_1}{z_2-z_1}\right\} \left[\frac{\sin(k \cdot z_1 z_2/d)}{2\pi d}\right]^2}{\frac{\Gamma}{8\pi} \cdot \frac{\lambda \cdot l_h}{\lambda^2 + [2\pi l_h \gamma_0]^2} \cdot \frac{\lambda \cdot l_v}{\lambda^2 + [2\pi l_v \gamma_0(\bar{h}-z_1)]^2}} \cdot \frac{\left[(\lambda d/4\pi^3)^2 + (z_2 - \bar{h})^2\right]^{1/2}}{d^3}$$

b) for the urban and sub-urban environments following [10, 15], we finally get:

$$K = \frac{I_{co}}{I_{inc_1} + I_{inc_2}} = \frac{\exp\left\{-\gamma_0 d \frac{(z_1-\bar{h})}{(z_2-z_1)}\right\} \frac{\sin^2(k \cdot z_1 z_2/d)}{4\pi^2 d^2}}{\frac{\Gamma \cdot \lambda \cdot l_v \left[(\lambda d/4\pi^3) + (z_2-\bar{h})^2\right]^{1/2}}{8\pi[\lambda^2 + (2\pi l_v \gamma_0 \cdot (z_1-\bar{h}))^2] d^3}} + \frac{\Gamma^2 \lambda^3 l_v^2 \left[(\lambda d/4\pi^3) + (z_2-\bar{h})^2\right]}{24\pi^2 [\lambda^2 + (2\pi \cdot l_v \cdot \gamma_0 \cdot (z_1-\bar{h}))^2]^2 d^3} \quad (25b)$$

Figure 8:
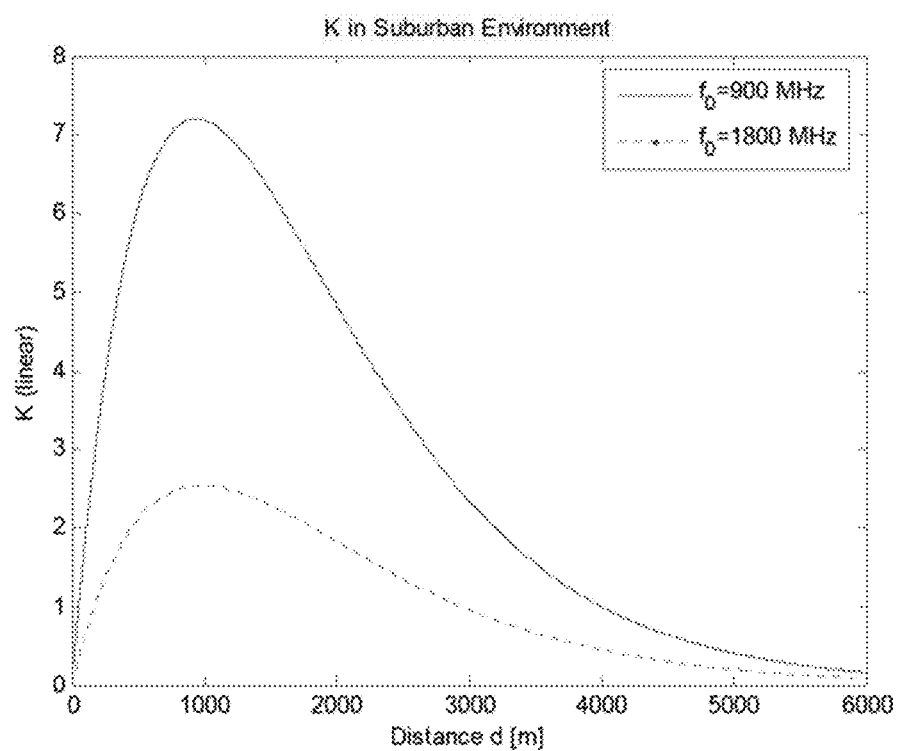
FIG. 8 shows a graph of K-factor versus distance between BS and MS at $f_0$=900 and 1800 MHz.

Thus, for experiment carried in mixed residential area, the results of K-factor computation are shown in FIG. 8 for f=900 MHz and 1800 MHz. As is clear seen, the criteria to use the maximum radius of cell can be determined by maximal value of K versus the distance.

Figure 9:
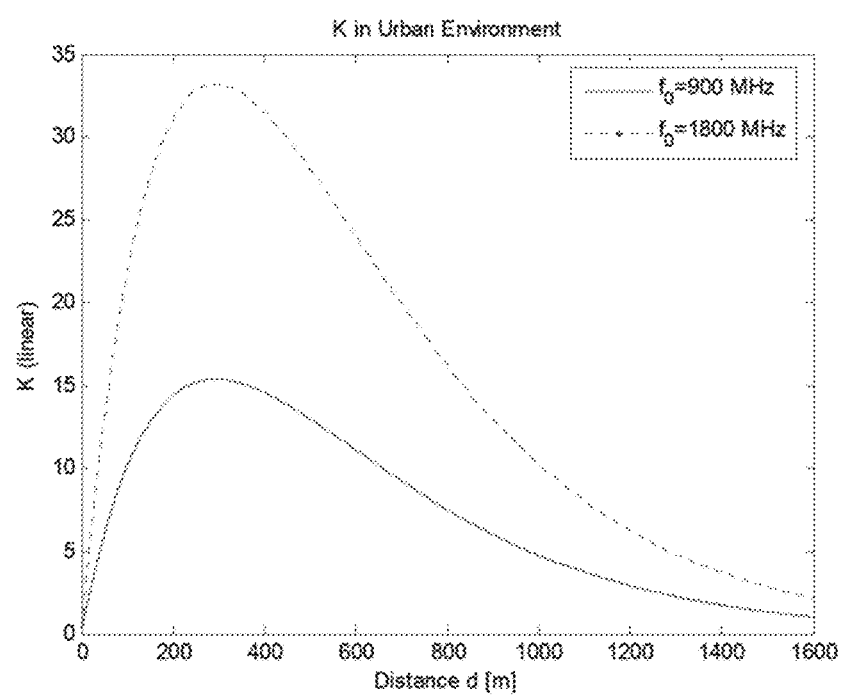
FIG. 9 shows a graph of K-factor versus distance between BS and MS at $f_0$=900 and 1800 MHz.

From illustration made by FIG. 8, this radius can be estimated as about 1.0-1.2 km, whereas for the same conditions formula (23) gives for the minimum cell radius value of 570 m. The same computations made for urban area ("market-site" of Ramat-Gan, described in Section III) at the same frequencies, allow us to estimate the maximum cell radius of about 320-350 m (see FIG. 9), whereas for the same conditions using formula (4.3) the estimation value of minimum radius is about 170-180 m.

Real experiments carried out in both areas showed that the stable communication between BS and any user located in area of service can be achieved for the mixed area up to 1 km and for the tested urban area is about 400-450 m. These estimations again show that using the proposed stochastic approach with definitions of the minimum cell radius by (23) and of the maximum cell radius by K-parameter from (25), we can a-priory predict the cell radius of the area where stable communication between users and BS antenna can be achieved.

Definition of Cell Radius Via Maximum Acceptable Path Loss. Another method of cell radius estimation is to use information about total link budget in the channel accounting both slow and fast fading, i.e., about the maximum link budget. Of how to estimate this parameter we discussed above. Now using formula (4) with (2)-(3) for fast fading, and based on results obtained from the novel stochastic model described by (21)-(28), we can estimate the maximum and minimum cell radius. Let us again use data of experiment carried out in Ramat-Gan experimental site described above. Following the same approach as was done for link budget design and K-factor estimation for this propagation scenario, we have found the following results.

Thus, the attenuation loss according to slow fading is changed from 7.1 to 7.2 dB, that is, approximately constant with the range between the BS and MS antennas. At the same time the probability to obtain this loss is changed from about 0.4 at the 100 m from the BS station to about 0.9 at the 500 m from the base station.

The same computations for the attenuation loss due to fast fading give about 32 dB at the distance of 100 m from the BS antenna and about 42 dB at the 500 m from the BS antenna with the corresponding probability of 0.7 and about 1, respectively. Then, according to estimations made above for link budget design in Ramat-Gan experimental area, described above, the total loss is changed from about 105 dB (at the distance of 100 m) to about 140 dB (at the distance of 500 m). Taking into account that the acceptable path loss of the system (which was used in the corresponding experiment) is 138 dB, we have that the maximum radius of the cell can be not more that 420 m. So, according to these estimations one can see that instead of to use the formulas for K-factor estimations, which give us the cell radius $R_{min} \approx 320$ m, we have $R_{max} \approx 420$ m accounting maximum acceptable signal loss with the corresponding probability of fast and slow fading.

Of course, this radius is larger than the minimum one, but smaller or at the same order as that of about 400-450 m obtained experimentally in the Ramat-Gan experimental area.

So, even using information of the K-factor described the fast fading phenomena, its probability and the corresponding loss, or using the maximum accepted path loss, accounting both fading, the slow and fast, with their corresponding probabilities and loss, one can estimate more precisely the cell radius instead of simple formula (23) or (24), following the stochastic model. The later can give a-priory only an order of magnitude of cell radius. Using more precise approach described above, we can increase the radius of cell essentially, which allows designers of cellular maps to increase the areas of service for each individual base station, and finally the number of users located in such areas, i.e., increase both quality and grade of service.

GOS Prediction Based on Stochastic Model

Another detailed analysis based on propagation phenomena in different built-up areas can be done to determine the co-channel interference parameter C/I, which describes ration of the signal of any carrier/user to noise due to interference between other carriers/users located in areas of service. This parameter determines the Quality of Service of subscribers by various wireless networks. According to the propagation situation in urban scene for cell sites located beyond the break point ranger $r_B$, we can present the carrier-to-interference ratio, C/I, taking into account the multipath phenomenon and obstructions which change the signal decay law from $D^{-2}$ to $D^{-\gamma}$, $\gamma = 2 + \Delta\gamma$, $\Delta\gamma \geq 1$. Hence, we finally have instead of (6):

$$\frac{C}{I} = 10 \log\left[\frac{1}{6}\left(\frac{D^{(2+\Delta\gamma)}}{R_{cell}^2}\right)\right] \tag{26}$$

According to the novel concepts of cellular map construction presented above, the signal strength decay is weaker within each cell (with path-loss slope parameter $\gamma = 2$) and corresponds to that in free space. At the same time due to obstructions the signal strength decay is stronger in regions outside the servicing cell and within the co-channel site (with path-loss slope parameter $\gamma = 2 + \Delta\gamma$, $\Delta\gamma \geq 1$). Therefore, we can rewrite (26) versus number of cells in cluster, N, and of radius of the individual cell, $R_{cell}$, by use the fact that the reuse factor $Q = D/R_{cell} = \sqrt{3N}$ and $$\frac{C}{I} = 10 \log\left[\frac{N}{2}(3N)^{\frac{\Delta\gamma}{2}} R_{cell}^{\Delta\gamma}\right] \tag{27}$$

Let us examine this equations for two typical cases described above. In this case of typical crossing straight wide avenues, for which according to multi-slit street waveguide model $\Delta\gamma = 2(\gamma = 4)$, we get $$\frac{C}{I} = 10 \log\left[\frac{3}{2}(N)^2 R_{cell}^2\right] \tag{28}$$

For the case of narrow streets (more realistic case in urban scene) one can put in (28) $\Delta\gamma = 1-3$ ($\gamma = 3-7$), which is close to the exponential signal decay that follows from the street waveguide model.

For the case of propagation over irregular built-up terrain, as follows from the stochastic multi-parametric approach, presented above, $\Delta\gamma = 1$ and the C/I-ratio prediction equation is follows:

$$\frac{C}{I} = 10 \log\left[\frac{N}{2}(3N)^{1/2} R_{cell}\right] \tag{29}$$

As follows from (26)-(29), the C/I-ratio strongly depends on conditions of wave propagation within the urban communication channels (on path-loss slope parameter $\gamma = 2 + \Delta\gamma$, $\Delta\gamma \geq 1$) and on the cellular map splitting strategy (on parameters N and $R_{cell}$). In fact, as follows from formulas presented above, the C/I performance is enhanced if the cell radius $R_{cell}$ is within the break point range and the reuse distance D is beyond this range.

Figure 10:
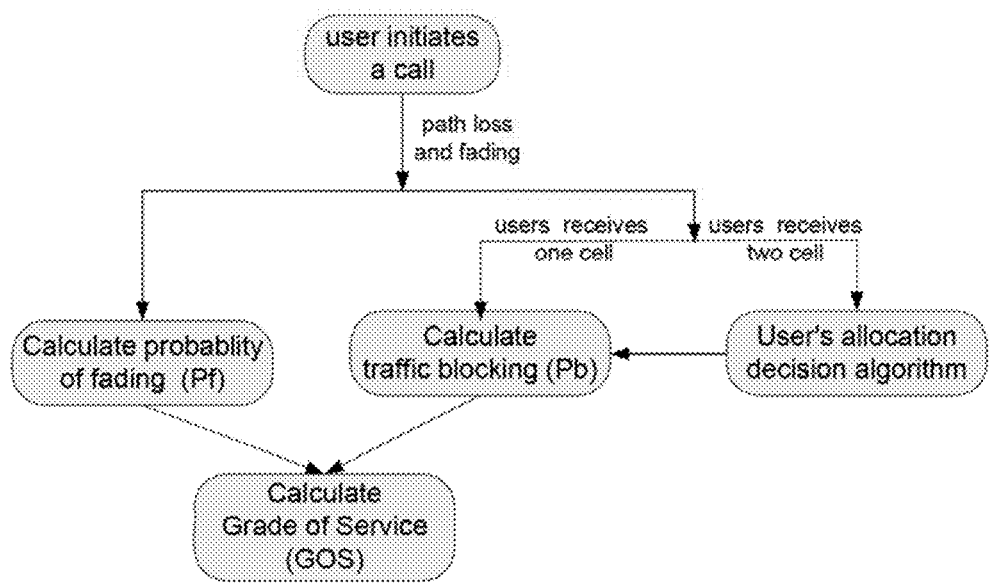
FIG. 10 shows a flowchart of the proposed algorithm.

For GOS evaluation, the corresponding block-scheme of the proposed algorithm is presented in FIG. 10. Using this algorithm, we calculate the probability of an unsuccessful call per user that initiates an outgoing call. In each cell position, which is equivalent to one overlapping, we simulate the traffic and overlapping parameters, that is, the blocking probability, due to channel congestion, $P_b$, the probability due to shadowing (or slow fading), $P_f$, and GOS, as a convolution of these two probability functions:

$$GOS = P_b \cdot (1 - P_f) + P_f (1 - P_b) \tag{30}$$

Each simulation generates the data that includes the simulated results as described above, for three propagation models and one decision algorithm. In the case of random decision algorithms we take probability of 50%. We ran this simulation for three algorithms so we can get every combination we want. We also ran this simulation seven times; each time we changed the number of users.

Figure 11:
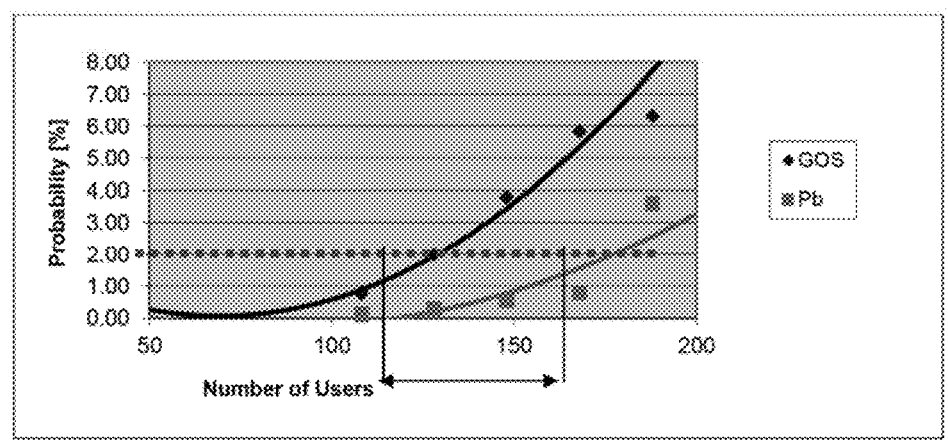
FIG. 11 shows a graph of GOS and load calculation.

Two graphs of GOS and load computation, using the same propagation model and algorithm sketched in FIG. 10, are shown in FIG. 11, where one is the probability of blocking due to traffic load (denoted by $P_b$) and the other is the GOS with the fading phenomena taken into account. Both graphs are for one overlapping scenario and each point of the scattered points of this graph represents one simulation with a specific number of users. We can see from these graphs that if we need, for example, a GOS of 2%, by considering the fading (as seen in GOS graph), we can load a capacity of 50 users less than that without taking into account the fading. We, thus, see that by taking the fading into account we get 30% less quality of service.

More complicated case we will obtain taking into account both slow and fast fading. Thus, based on fading results (slow fading and on how to take into account fade margin, we can present the total probability of GOS, using the following formula: fast fading, described above, as well as using algorithm shown in FIG. 10:

$$GOS = P_b \cdot (1 - \tilde{P}_f) + \tilde{P}_f (1 - P_b) \quad (31)$$

where $$\tilde{P}_f = P_{slow\_fading} \cdot P_{fast\_fading} \quad (32)$$

Value of $P_b$ we computed, using classical model of loading computation for different number of users for all three scenarios for connection to the system (random, predefined and controlled introduced above).

The probabilities of slow and fast fading occurrence can be found using methods described above by formulas (21)-(25), respectively. We present below results of numerical simulation for the some specific urban area with the following parameters of the terrain and the virtual experiment:

$$F = 1000 \text{ MHz}; \lambda = 0.33 \text{m}; z_1 = 5\text{m}; z_2 = 35\text{m}; h_1 = 10\text{m};$$
$$h_2 = 30\text{m};$$

$$\Gamma = 0.7; \gamma_0 = 1 \text{ km}^{-1}; l_v = 1 \text{ m}; \overline{L} = 10 \text{ m}; n = 1. \quad (33)$$

Here, according to, we consider three scenarios of selection or decision policies presented in Tables 2-4.

Based on results presented there, we notice that by taking into account only slow fading phenomena, which is mostly important in urban and sub-urban areas, we significantly increase blocking probability (at 5-8 times) for less than 40% of overlapping and of about twice for overlapping of more than 50%.

a) Results for random search scenario ("Random") and number of users is n=20 ($P_{blocking}$=3.15%).

TABLE 2

| Random, n = 20 | 0.5 km | 1 km | 1.5 km | 2 km |
|---|---|---|---|---|
| $P_{blocking}$ | 3.15% | 3.15% | 3.15% | 3.15% |
| $P_{slow\_fading}$ | 24% | 26% | 27% | 28% |
| $P_{fast\_fading}$ | 2.3% | 6.4% | 13.5% | 17.8% |
| GOS | 3.67% | 4.71% | 6.57% | 7.82% | b) Results for predefined search ("Min_Load") scenario and number of users is n=20 ($P_{blocking}$=3.16%).

TABLE 3

| Predefined, n = 20 | 0.5 km | 1 km | 1.5 km | 2 km |
|---|---|---|---|---|
| $P_{blocking}$ | 3.19% | 3.19% | 3.19% | 3.19% |
| $P_{slow\_fading}$ | 24% | 26% | 27% | 28% |
| $P_{fast\_fading}$ | 2.3% | 6.4% | 13.5% | 17.8% |
| GOS | 3.68% | 4.72% | 6.57% | 7.83% | c) Results for controlled resources ("SS") search police and number of users n=20 ($P_{blocking}$=1.8%).

TABLE 4

| Controlled, n = 20 | 0.5 km | 1 km | 1.5 km | 2 km |
|---|---|---|---|---|
| $P_{blocking}$ | 1.80% | 1.80% | 1.80% | 1.80% |
| $P_{slow\_fading}$ | 24% | 26% | 27% | 28% |

TABLE 4-continued

| Controlled, n = 20 | 0.5 km | 1 km | 1.5 km | 2 km |
|---|---|---|---|---|
| $P_{fast\_fading}$ | 2.3% | 6.4% | 13.5% | 17.8% |
| GOS | 2.33% | 3.40% | 5.31% | 6.60% |

QoS Prediction Based on the Stochastic Model

In order to characterize quality-of-service (QoS) of a wireless channel, and determine its quality of how it transfer the data stream, several parameters are usually used, which allow to estimate the quality of the received data versus the sent data such as SNR, BER, and parameters that describe the quality of the transmitted signal along the transmission channel, such as capacity C and spectral efficiency $\tilde{C}$.

We propose a unified approach, based on the stochastic multi-parametric model, which can be used in cases of dynamic communication channels with fading, flat or multiplicative, where an additional source of noise, called multiplicative noise, can be introduced.

Taking into account the fading phenomena, we can estimate the multiplicative noise and then introduce its effective power, $N_{mul}$, into denominator of (18), i.e., $$C = B_\omega \log_2 \left[ 1 + \frac{S}{N_0 B_\omega + N_{mul}} \right] \quad (34)$$

We have proved that formula (34) is valid when the LOS component of the total signal inside a channel exceeds the NLOS component, that is, when K-factor more than the SNR [39]. In this case we can define, the $N_{mul}$ as a "Gaussian-like" noise. If so, we can be rewrite (8.1) in the presence of multiplicative noise as:

$$C = B_w \log_2 \left( 1 + \frac{S}{N_{add} + N_{mul}} \right) = B_w \log_2 \left( 1 + \left( \frac{N_{add}}{S} + \frac{N_{mul}}{S} \right)^{-1} \right) \quad (35)$$

where, as above, $$\frac{S}{N_{add}} = SNR_{add}$$

and $$\frac{S}{N_{mul}} = \frac{I_{co}}{I_{inc}}.$$

Here we use the definition of K as the ratio $$K = \frac{I_{co}}{I_{inc}}$$

(see formula (5)). Using these notations, we finally get the capacity as a function of the K-factor and the additive noise:

$$C = B_w \log_2 \left( 1 + (SNR_{add}^{-1} + K^{-1})^{-1} \right) = B_w \log_2 \left( 1 + \frac{K \cdot SNR_{add}}{K + SNR_{add}} \right) \quad (36)$$

From (8.3) it is easy to obtain the spectral efficiency of the channel:

$$\tilde{C} = \frac{C}{B_w} = \log_2\left(1 + \frac{K \cdot SNR_{add}}{K + SNR_{add}}\right) \quad (37)$$

where the bandwidth $B_w$ changes according to the given multiple access system.

Again, we notice that formulas (36) and (37), as well as (34), are valid when the K factor is larger than the $SNR_{add}$. As was shown by numerous experiments, in real land communication links, the parameter K can exceed 10 dB. At the same time, in urban and sub-urban areas the $SNR_{add}$ parameter can not exceed 8-10 dB [39].

As follows from, where this statement was checked numerically, the classical approach and that based on the stochastic model gives the same capacity up to SNR=10-12 dB for K>15 dB. We can use in our future evaluations the approximate formulas (36) and 27) for predicting the data stream capacity or the spectral efficiency in urban and sub-urban communication links.

Finally, using the BER definition (17), where p(x) is Ricean PDF and the SNR includes multiplicative noise, we finally get:

$$BER(K, SNR_{add}, \sigma) = \quad (38)$$

$$\frac{1}{2}\int_0^\infty \frac{x}{\sigma^2} \cdot e^{-\frac{x^2}{2\sigma^2}} \cdot e^{-K} \cdot I_0\left(\frac{x}{\sigma}\sqrt{2K}\right) \cdot \text{erfc}\left(\frac{K \cdot SNR_{add}}{2\sqrt{2}(K+SNR_{add})}x\right)dx$$

where $\sigma$ is the standard deviation of the signal strength as a random variable. In order to create BER versus capacity, we will express K as a function of C using (36) and (37), i.e., $$K = \frac{SNR_{add}\left(2^{\frac{C}{B_w}}-1\right)}{SNR_{add} - \left(2^{\frac{C}{B_w}}-1\right)} = \frac{SNR_{add}\left(2^{\tilde{C}}-1\right)}{SNR_{add} - \left(2^{\tilde{C}}-1\right)} \quad (39)$$

Then, using (8.5), we get the BER as a function of $\tilde{C}$:

$$BER(\tilde{C}) = \quad (40)$$

$$\frac{1}{2}\int_0^\infty \frac{x}{\sigma^2} \cdot e^{-\frac{x^2}{2\sigma^2}} \cdot e^{-\frac{SNR_{add}(2^{\tilde{C}}-1)}{SNR_{add}-(2^{\tilde{C}}-1)}} \cdot I_0\left(\frac{x}{\sigma}\sqrt{2\frac{SNR_{add}(2^{\tilde{C}}-1)}{SNR_{add}-(2^{\tilde{C}}-1)}}\right) \cdot$$

$$\text{erfc}\left(\frac{\frac{SNR_{add}(2^{\tilde{C}}-1)}{SNR_{add}-(2^{\tilde{C}}-1)} \cdot SNR_{add}}{2\sqrt{2}\left(\frac{SNR_{add}(2^{\tilde{C}}-1)}{SNR_{add}-(2^{\tilde{C}}-1)} + SNR_{add}\right)}x\right)dx$$

After straightforward computations formula (40) reduces to $$BER(\tilde{C}) = \quad (41)$$

$$\frac{1}{2}\int_0^\infty \frac{x}{\sigma^2} \cdot e^{-\frac{x^2}{2\sigma^2}} \cdot e^{-\frac{SNR_{add}(2^{\tilde{C}}-1)}{SNR_{add}-(2^{\tilde{C}}-1)}} \cdot I_0\left(\frac{x}{\sigma}\sqrt{2\frac{SNR_{add}(2^{\tilde{C}}-1)}{SNR_{add}-(2^{\tilde{C}}-1)}}\right) \cdot$$

$$\text{erfc}\left(\frac{(2^{\tilde{C}}-1)}{2\sqrt{2}}x\right)dx$$

This is a very important formula, which gives relation between the spectral efficiency of the multipath communication channel with fading, caused by multiple reflection, scattering and diffraction, which fully described by formulas obtained above by use unified stochastic multi-parametric approach, and the probability of BER of the information data stream inside such a channel.

Figure 12:
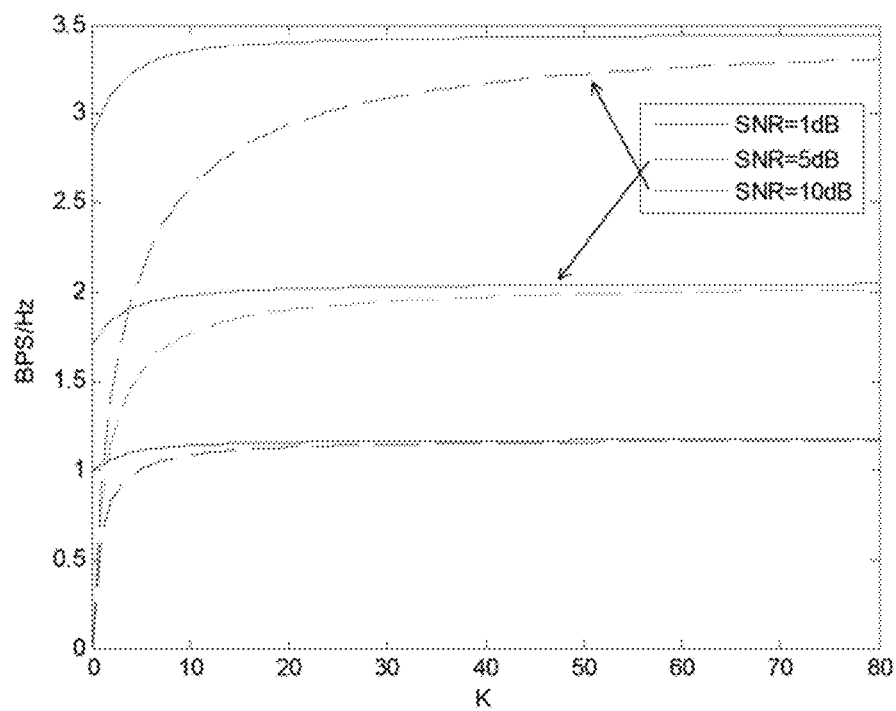
FIG. 12 shows a graph of spectral efficiency as a function of K-factor.

We have constructed a general algorithm for the minimization of BER and maximization of capacity or spectral efficiency for different wireless networks. We have analyzed the changes of the capacity or spectral efficiency (for known bandwidth of the channel) as a function of K, i.e., as function of different propagation conditions occur within the wireless communication channel, using equations (36)-(37). We have examined the spectral efficiency for three different typical values of $SNR_{add}$, which is shown in FIG. 12.

It is obviously seen, that with the increase in SNR (from 1 dB to 10 dB) the spectral efficiency is increased by more than 3 times. This effect is more significant for the worst case of multipath fading channels, when for K<5.

Figure 13:
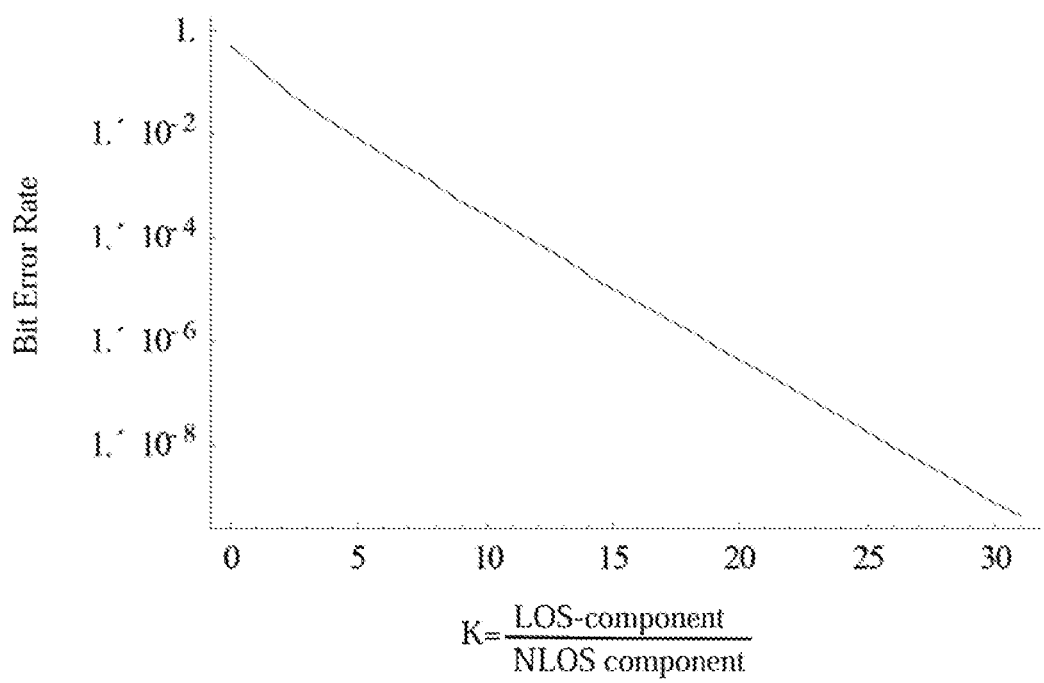
FIG. 13 shows a graph of BER as a function of K.
Figure 14:
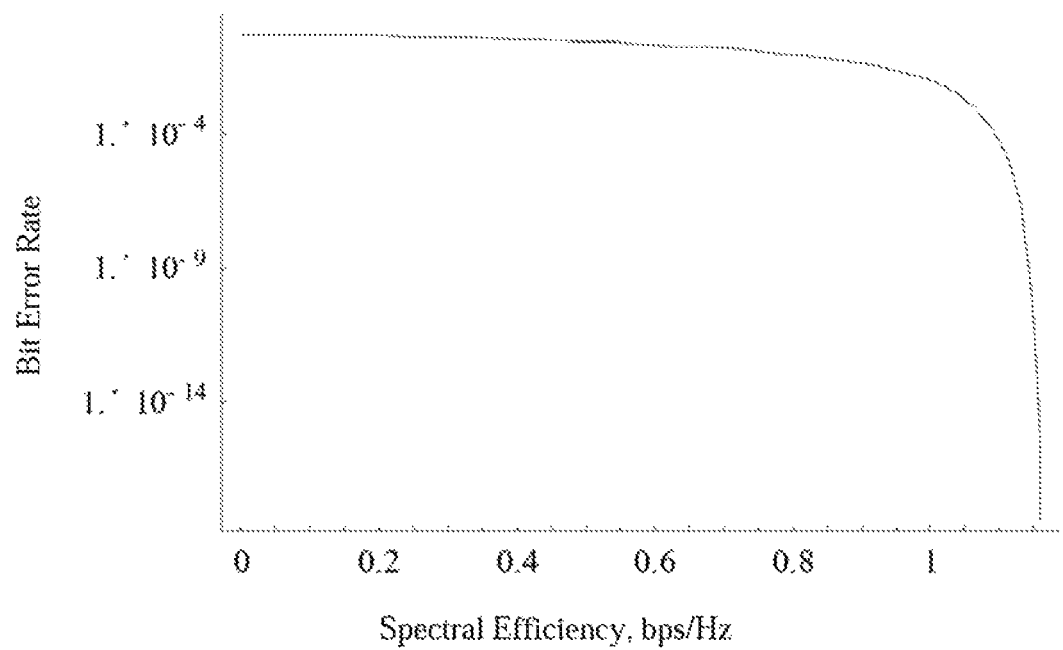
FIG. 14 shows a graph of BER as a function of $\tilde{C}$.

To investigate BER in various propagation channels, we performed two simulations: the first one was BER as a function of K (LOS to NLOS ratio) using equation (38), and the second was BER as a function of spectral efficiency, using equation (41). The parameters we used were: $\sigma=2$, and $SNR_{add}=1$ dB. The results of the computation are shown in FIG. 13 and FIG. 14, respectively.

With increase of K parameter, that is, when LOS component becomes predominant with respect to NLOS multipath components, BER decreases essentially, from $10^{-2}$ for K≈5 to $10^{-6}$ for K≈20 (corresponds to urban areas with high base station antenna). At the same time, as expected, the spectral efficiency is also increased. Hence, with the increase of the spectral efficiency of the data stream, a simultaneous sharp increase of BER is also noted.

All the derivations mentioned above allow us to obtain correlations between concrete situation in the propagation channel, the parameters of the channel, and the parameters of the information data stream. All this information allow designers of wireless communication networks to obtain a-priori useful information about the area, where such a system is planned to be deployed and what kind of system is applicable for the environments of interest.

References

[1] Okumura, Y., E. Ohmori, T. Kawano, and K. Fukuda, "Field strength and its variability in the VHF and UHF land mobile radio service", *Review Elec. Commun. Lab.*, vol. 16, pp. 825-843, 1968.

[2] Hata, M., "Empirical formula for propagation loss in land mobile radio services", *IEEE Trans. Veh. Technol.*, vol. VT-29, pp. 317-325, 1980.

[3] Walfisch, J. and H. L. Bertoni, "A theoretical model of UHF propagation in urban environments", *IEEE Trans. Anten. and Propagat.*, vol. AP-38, pp. 1788-1796, 1988.

[4] Xia, H. H. and H. L. Bertoni, "Diffraction of cylindrical and plane waves by an array of absorbing half screens", *IEEE Trans. Anten. and Propagat.*, vol. 40, pp. 170-177, 1992.

[5] Bertoni, H. L., W. Honcharenko, L. R. Maciel, and H. H. Xia, "UHF propagation prediction for wireless personal communications", *Proc. IEEE*, vol. 82, no. 9, pp. 1333-1359, 1994.

[6] Bertoni, H. L., *Radio Propagation for Modern Wireless Systems*, New Jersey: Prentice Hall PTR, 2000.

[7] Lee, J. S., and L. E. Miller, "Walfisch-Ikegami formula", in *CDMA Systems Enginnering Handbook*, Artech House, 1988, pp. 190-199.

[8] Ponomarev, G. A., and N. Sh. Blaunstein, "Average field intensity in the urban street scene", *Proc. of Radiophys. Conference*, Tomsk, USSR, 1972, pp. 76-78.

[9] Ponomarev, G. A., A. N. Kulikov, and E. D. Telpukhovsky, *Propagation of Ultra-Short Waves in Urban Environments*, Tomsk: Rasko, USSR, 1991.

[10] Blaunstein, N., Chapter 12: *Wireless Communication Systems*, in *Handbook of Engineering Electromagnetics*, ed. by R. Bansal, New Jersey: Marcel Dekker, 2005, pp. 417-481.

[11] Steele, R., *Mobile Radio Communications*, New York: Pentech Press, 1993.

[12] Jakes, W. C., *Microwave Mobile Communications*, New York: John Wiley and Son, 1974.

[13] Rappaport, T. S., *Wireless Communications*, New York: Prentice Hall PTR, 1996.

[14] Saunders, S. R., *Antennas and Propagation for Wireless Communication Systems*, New York: John Wiley & Sons, 1999.

[15] Santiago, R. Ch., and V. Lyandres, "A sequential algorithm for optimal base station location in a mobile radio network", in *Proc. of 2004 IEEE 15th Int. Symp. on Personal, Indoor and Mobile Radio Communic.*, Barcelona, Spain, Sep. 5-8, 2004.

[16] Santiago, R. Ch., A. Raymond, V. Lyandres, and V. Ya. Kontorovitch, "Effective base stations location and frequency assignment in mobile radio networks", in *Proc. of 2003 IEEE Int. Symp. on Electromagn. Compatibility*. Istambul, Turkey, May 11-16, 2003.

[17] Santiago, R. Ch., E. Gigi, and V. Lyandres, "An improved heuristic algorithm for frequency assignment in non-homogeneous cellular mobile networks", in *Proc. of 2004 IEEE 60th Veh. Technol. Conf.*, Los Angeles, Calif., Sep. 26-29, 2004.

[18] Gamst, A., and E. G. Zinn, "Cellular radio network planning", *IEEE Aerosp. Electron. Syst. Magazine*, vol. 1, No. 1, 1985\6, pp. 8-11.

[19] Akl, R. G., M. V. Hegde, M. Naraghi-Pour, and P. S. Min, "Cell placement in CDMA network", in *Proc. of the IEEE Wireless Communic. and Networking Conf.*, vol. 2, 1999, pp. 903-907.

[20] Eisenblatter, A., A. Fugenschuh, T. Koch, A. Koster etc, "Modeling feasible network configurations for UMTB", ZIB, Berlin, *Tech. Rep.* 02-16, March 2002.

[21] Hurley, S., "Planning effective cellular mobile radio networks", *IEEE Trans. Veh. Technol.*, vol. 51, No. 2, 2002, pp. 48-56.

[22] Tutschku, K., and P. Tran-Gia, "Spatial traffic estimation and characterization for mobile communication network design", *IEEE J. Select. Areas Communic.*, vol. 16, No. 5, 1998, pp. 804-811.

[23] Hurley, S., R. M. Whitaker and D. H. Smith, "Channel assignment in cellular networks without channel separation constraints", in *Proc. of 2000 IEEE Veh. Technol. Conf.*, Boston, Mass., Sep. 24-28, 2000.

[24] Hurley, S., "Automatic base station selection and configuration in mobile networks", in *Proc. of 2000 IEEE Veh. Technol. Conf.*, Boston, Mass., September 24-28, 2000.

[25] Wu, J.-L. C., and L.-Y. Wey. "Channel assignment for cellular cellular mobile networks with non-uniform cells", *IEE Proc. Communic.*, vol. 145, December 1998, pp. 451-456.

[26] Stuber, G. L., *Principles of Mobile Communication*, Kluwer Academic Publishers, 1996.

[27] Syski, R., *Introduction to Congestion Theory in Telephone Systems*, $2^{nd}$ edition, New York, 1986.

[28] Nelson R., *Stochastic Processes and Queuing Theory*, Springer-Verlag, 1994.

[29] Andrews, L. C., Philips, R. L., Hopen, C. Y., *Laser Beam Scintillation with Applications, SPIE Press*, 2001.

[30] Blaunstein, N., and J. Bach Andersen, *Multipath Phenomena in Cellular Networks*, London-Boston: Artech Houses, 2002.

[31] Blaunstein, N., "Prediction of cellular characteristics for various urban environments", *IEEE Antennas and Propagatation Magazine*, vol. 41, No. 6, pp. 135-145, 1999.

[32] Blaunstein, N., et al., "Prediction of UHF path loss for forested environments", *Radio Science*, vol. 38, No. 3, 2003, pp. 1059-1075.

[33] Blaunstein, N., et al., "Radio propagation in rural residential areas with vegetation", *J. Electromagnetic Waves and Applications: Progress In Electromag. Research, PIER*, vol. 40, 2003, pp. 131-153.

[34] Blaunstein, N., et al., "Prediction of loss characteristics in built-up areas with various buildings' overlay profiles", *IEEE Antennas and Propagation Magazine*, vol. 44, No. 1, pp. 181-192, 2002.

[35] Blaunstein, N., "Distribution of angle-of-arrival and delay from array of buildings placed on rough terrain for various elevations of base station antenna", *Journal of Communications and Networks*, vol. 2, No. 4, pp. 305-316, 2000.

[37] Blaunstein, N., et al., "Unified approach of GOS optimization for fixed wireless access", *IEEE Transactions on Vehicular Technologies*, vol. 51, No. 1, pp. 101-110, January 2002.

[38] Blaunstein, N., and R. Hassanov, "Grade of service design in wireless systems operating in multipath fading environments", *J. World Markets Series: Business Briefings, Wireless Technologies*, No. 1, pp. 95-102, 2004.

[39] Blaunstein, N., and C. Christodoulou, *Adaptive Antennas and Radio Propagation in Wireless Communication Links: Terrestrial, Atmospheric and Ionospheric*, Wiley & Sons, New York, 2007.

The invention claim is:

1. A method of analyzing a wireless network located in a terrestrial environment comprising the steps of:
   a. obtaining built-up terrain elevation data;
   b. computing three-dimensional radio path profile;
   c. creating a digital map cover comprising actual heights of obstructions in said terrestrial environment;
   d. computing clearance conditions between antennas of said wireless network;
   e. computing an average path loss distribution;
   f. computing a standard deviation of slow fading, $\sigma_L$, being a logarithm of ratio between the signal intensity, with and without diffraction phenomena;
   g. computing the fade margin.

2. The method according to claim 1, wherein said step of creating the digital map based on at least one parameter; selected from a group consisting of a terrain elevation, a clutter distribution, an effective antenna height, an antenna pattern, an antenna directivity, an antenna effective radiated power and an operating frequency.

3. The method according to claim 1, wherein said step of computing average path loss distribution is provided in mixed residential areas, sub-urban areas, urban areas or any combination thereof.

4. The method according to claim 1, wherein said step of computing said standard deviation of slow fading, $\sigma_L$, is performed either for single diffraction and double diffraction scenarios.

5. The method according to claim 1, wherein said step of computing said fade margin is performed both in the cases of slow and fast fading.

6. The method according to claim 1, comprising a step of distinguishing areas according to computed path losses based on at least one parameter selected from a group consisting of a terrain elevation, a clutter distribution, an effective antenna height, an antenna pattern, an antenna directivity, an effective radiated power and an operating frequency.

7. The method according to claim 1, comprising a step of computing an efficient cell radius of an area of stable communication between users and base station antenna based on K-parameter and a minimum cell radius.

8. The method according to claim 7, wherein the step of defining computing said efficient cell radius is performed for area selected from the group consisting of a mixed residential area, a sub-urban area, a urban area and any combination thereof.

9. The method according to claim 7, wherein said step of computing said efficient cell radius is performed providing maximum acceptable path losses.

10. The method according to claim 1, comprising a step of determining a co-channel interference parameter and signal-to-noise ratio.

* * * * *